(12) United States Patent
Natori

(10) Patent No.: US 6,898,120 B2
(45) Date of Patent: May 24, 2005

(54) NONVOLATILE SEMICONDUCTOR MEMORY DEVICE

(75) Inventor: Kanji Natori, Fujimi-machi (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/728,746

(22) Filed: Dec. 8, 2003

(65) Prior Publication Data

US 2005/0001261 A1 Jan. 6, 2005

(30) Foreign Application Priority Data

Dec. 10, 2002 (JP) ........................................ 2002-357863

(51) Int. Cl.[7] ............................................. G11C 16/04
(52) U.S. Cl. ........................... 365/185.14; 365/185.15; 365/185.23; 257/319; 257/320
(58) Field of Search ................. 257/316, 319, 257/320; 365/185.14, 185.15, 185.23

(56) References Cited

U.S. PATENT DOCUMENTS

| | | | | |
|---|---|---|---|---|
| 5,280,446 A | * | 1/1994 | Ma et al. ............... | 365/185.15 |
| 5,402,371 A | * | 3/1995 | Ono ........................ | 365/185.07 |
| 5,408,115 A | | 4/1995 | Chang ..................... | 253/324 |
| 5,422,504 A | | 6/1995 | Chang et al. ........... | 365/185.15 |
| 5,455,792 A | * | 10/1995 | Yi ........................... | 365/185.15 |
| 5,494,838 A | | 2/1996 | Chang et al. ............. | 438/264 |
| 5,969,383 A | | 10/1999 | Chang et al. .............. | 257/316 |
| 6,177,318 B1 | | 1/2001 | Ogura et al. .............. | 438/267 |
| 6,248,633 B1 | * | 6/2001 | Ogura et al. ........ | 257/E21.679 |
| 6,255,166 B1 | | 7/2001 | Ogura et al. .............. | 438/257 |
| 6,587,381 B2 | * | 7/2003 | Kanai et al. ............ | 365/185.28 |

FOREIGN PATENT DOCUMENTS

| | | |
|---|---|---|
| JP | A 06-181319 | 6/1994 |
| JP | A 07-161851 | 6/1995 |
| JP | A 11-074389 | 3/1999 |
| JP | B1 2978477 | 9/1999 |
| JP | A 2001-156188 | 6/2001 |
| JP | A 2002-313090 | 10/2002 |

OTHER PUBLICATIONS

Yutaka Hayashi et al., "Twin MONOS Cell with Dual Control Gates", 2000 Symposium on VLSI Technology Digest of Technical Papers.

Kuo–Tung Chang et al., "A New SONOS Memory using Source–Side Injection for Programming", IEEE Electron Device Letters, vol. 19, No. 7, Jul. 1998, pp. 253–255.

Wei–Ming Chen et al., "A Novel Flash Memory Device with SPlit Gate Source Side Injection and ONO Charge Storage Stack (SPIN)", 1997 Symposium on VLSI Technology Digest of Technical Papers, pp. 63–64.

* cited by examiner

Primary Examiner—Son Mai
(74) Attorney, Agent, or Firm—Oliff & Berridge, PLC

(57) ABSTRACT

A memory cell array of a nonvolatile semiconductor memory device includes a plurality of memory cells disposed in a row direction and a column direction. The memory cell array includes a plurality of word lines. Each of the memory cells includes a source region and a drain region. Each of the memory cells includes a select gate and a word gate which are disposed to face a channel region between the source region and the drain region. Each of the memory cells includes a nonvolatile memory element formed between the word gate and the channel region. The word line drive section includes a plurality of unit word line drive sections. Each of the unit word line driver sections drives two of the word lines connected respectively with two of the word gates adjacent to each other in the column direction.

7 Claims, 10 Drawing Sheets

NONVOLATILE SEMICONDUCTOR MEMORY DEVICE

Japanese Patent Application No. 2002-357863 filed on Dec. 10, 2002, is hereby incorporated by reference in its entirety.

BACKGROUND OF THE INVENTION

The present invention relates to a nonvolatile semiconductor memory device including a nonvolatile memory element controlled by a word gate and a select gate.

As an example of a nonvolatile semiconductor memory device, a MONOS (Metal-Oxide-Nitride-Oxide-Semiconductor or -Substrate) nonvolatile semiconductor memory device is known. In the MONOS nonvolatile semiconductor memory device, a gate insulating film between a channel and a gate is formed of a laminate consisting of a silicon oxide film, a silicon nitride film, and a silicon oxide film and a charge is trapped in the silicon nitride film.

As the MONOS nonvolatile semiconductor memory device, a MONOS flash memory cell including a nonvolatile memory element (MONOS memory element) controlled by one select gate and one control gate has been disclosed (see Japanese Patent Application Laid-open No. 6-181319, Japanese Patent Application Laid-open No. 11-74389, and U.S. Pat. No. 5,408,115, for example).

BRIEF SUMMARY OF THE INVENTION

The present invention may provide a nonvolatile semiconductor memory device having a small layout area.

According to the present invention, there is provided a nonvolatile semiconductor memory device comprising a memory cell array including a plurality of memory cells disposed in a row direction and a column direction, wherein each of the memory cells includes a source region, a drain region, a channel region between the source region and the drain region, a word gate, a select gate, and a nonvolatile memory element formed between the word gate and the channel region, the word gate and the select gate being disposed to face the channel region, wherein the memory cell array includes:

a plurality of word lines each of which is commonly connected with the word gates of the memory cells in each row;

a plurality of bit lines each of which is commonly connected with the drain regions or the source regions of the memory cells in each column;

a word line driver section which drives the word lines; and a bit line driver section which drives the bit lines, wherein the word line driver section includes a plurality of unit word line driver sections, and wherein each of the unit word line driver sections drives two of the word lines connected respectively with two of the word gates adjacent to each other in the column direction.

According to the above configuration, since the number of the unit word line driver sections can be reduced up to half of the number of the word lines in the memory cell array, the layout area of the word line driver section can be reduced.

The two word lines driven by each of the unit word line driver sections may be short-circuited. This enables the unit word line driver section to drive the two word lines at the same time.

Each of the memory cells may include a first region adjacent to the source region and a second region adjacent to the drain region in the channel region. The select gate may be disposed over the first region and the word gate is disposed over the second region with the nonvolatile memory element interposed in-between.

Each of the memory cells may include a first region adjacent to the source region and a second region adjacent to the drain region in the channel region. The word gate may be disposed over the first region with the nonvolatile memory element interposed in-between and the select gate is disposed over the second region.

The memory cell array may include a plurality of select lines each of which is commonly connected with the select gates of the memory cells in each row, and a select line driver section which drives the select lines. The select line driver section may include a plurality of unit select line driver sections. At least one of the unit select line driver sections may drive two of the select lines connected respectively with two of the select gates adjacent to each other in the column direction.

According to the above configuration, since the number of unit select line driver sections can be fewer than the number of all the select lines, the layout area of the select line driver section can be reduced. This contributes to reduction of the manufacturing cost.

Two of the select lines connected respectively with two of the select gates adjacent to each other in the column direction driven by at least one of the unit select line driver sections may be short-circuited. This enables the number of unit select line driver sections to be half of the number of the select lines, whereby the manufacturing cost can be reduced.

The nonvolatile memory element may be formed of an ONO film which includes two oxide films (O) and a nitride film (N) between the two oxide films (O).

DETAILED DESCRIPTION OF THE EMBODIMENT

One embodiment of the present invention is described below with reference to the drawings.

Entire Configuration and Memory Block

Figure 1:
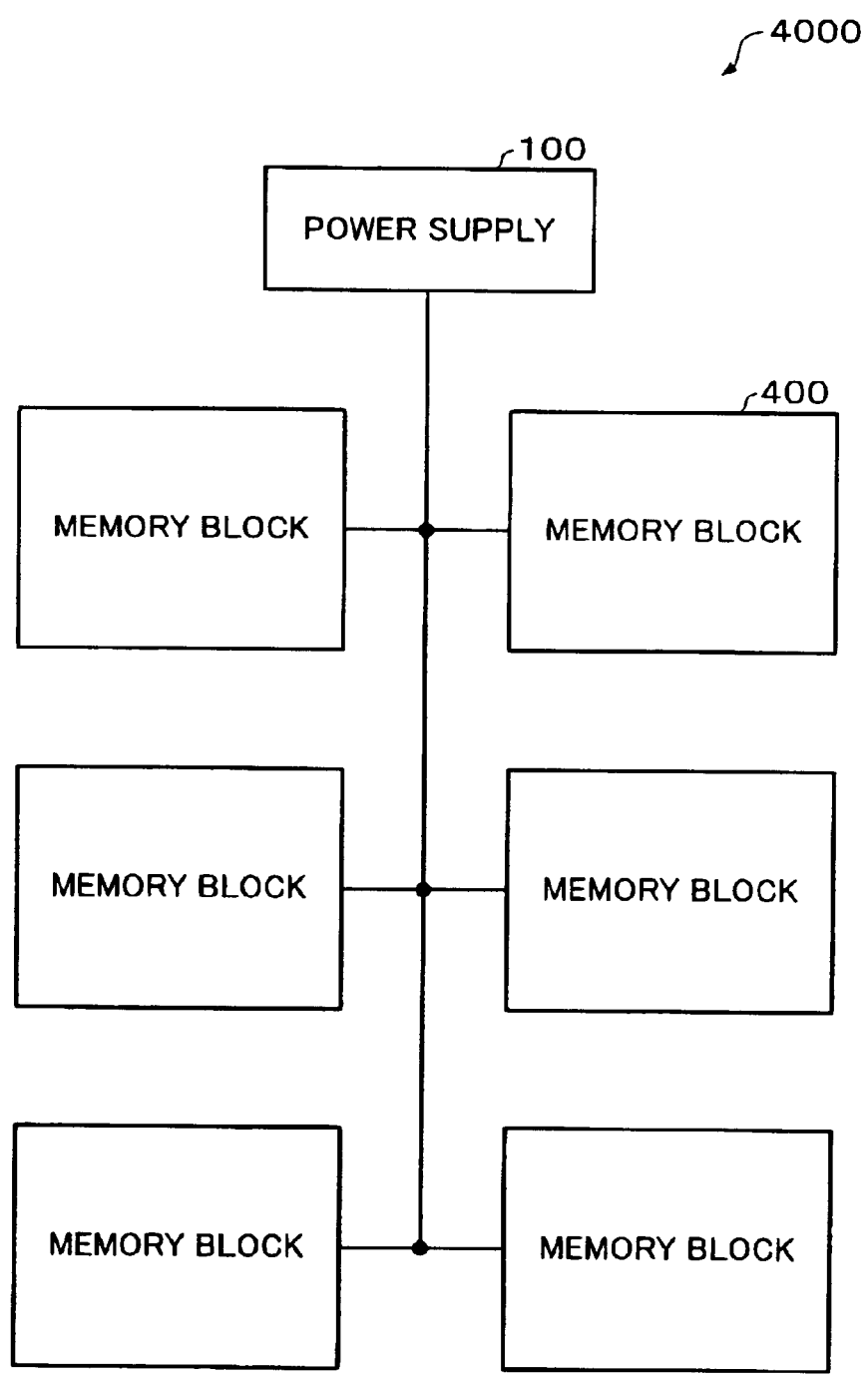
FIG. 1 is an overall diagram according to an embodiment of the present invention.

FIG. 1 is a block diagram showing the entire configuration of the present embodiment. A memory cell array 4000 includes a plurality of memory blocks 400. A plurality of different voltages are generated from a power supply circuit 100. The voltages generated are supplied to each memory block 400 through a plurality of voltage supply lines. The memory cell array 4000 includes a bit line driver section (not shown).

Figure 2:
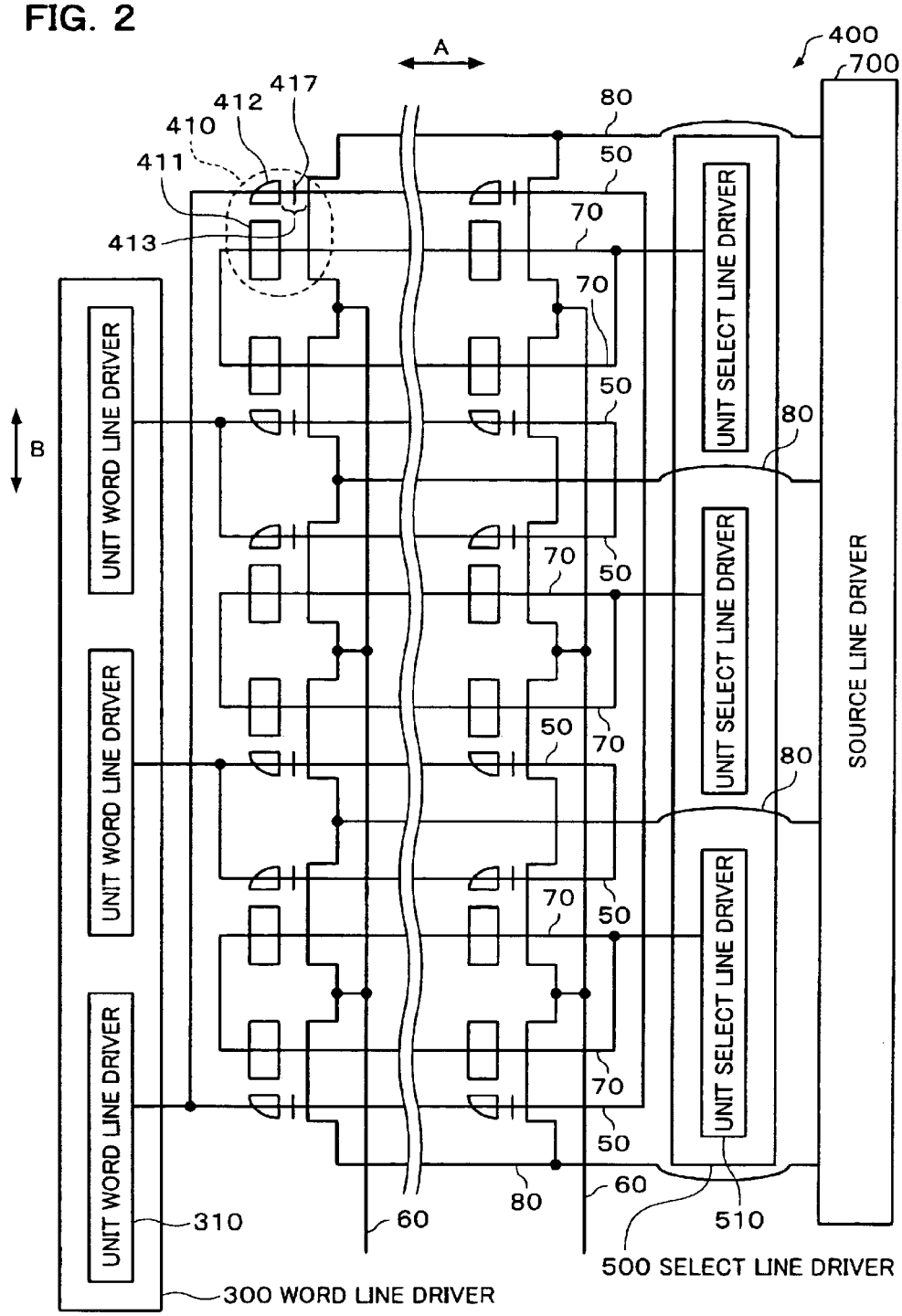
FIG. 2 is a diagram showing a configuration of a memory block of the present invention.

FIG. 2 is a circuit diagram showing the memory block 400 in detail. The memory block 400 includes a plurality of memory cells 410. The memory block 400 includes a word line driver section 300, a select line driver section 500, and a source line driver section 700.

The word line driver section 300 is made up of a plurality of unit word line driver sections 310. Each of the unit word line driver sections 310 inside the word line driver section 300 drives word lines 50 connected with the unit word line driver section 310.

The select line driver section 500 is made up of a plurality of unit select line driver sections 510. The unit select line driver section 510 drives select lines 70 connected with the unit select line driver section 510. The source line driver section 700 drives a plurality of source lines 80.

An area encircled by a dotted line in FIG. 2 is one memory cell 410. The memory cell 410 includes a select gate 411, a word gate 412, and an ONO film 413. A numeral 417 indicates a nitride film which makes up the ONO film. The structure of the memory cell 410 is described later in detail.

Each of the word lines 50 is formed along the row direction A, and connects the word gates 412 of the memory cells 410 in common. Each of the select lines 70 is formed along the row direction A, and connects the select gates 411 of the memory cells 410 in common.

Each of the bit lines 60 is formed along the column direction B, and connects bit line diffusion layers BLD (illustrated later) of the memory cells 410 in common. Each of the source lines 80 is formed along the row direction A, and connects source line diffusion layers SLD (illustrated later) of the memory cells 410 in common.

In FIG. 2, two adjacent word lines 50 among the word lines 50 are short-circuited on each end, and connected with one unit word line driver section 310. This enables the two word lines 50 to be driven by one unit word line driver section 310. This allows the number of unit word line driver sections 310 to be halved, whereby the layout area of the word line driver section 300 can be reduced. The above description also applies to the select line driver section 500. Specifically, each of the unit select line driver sections 510 drives two select lines 70. This enables the number of unit select line driver sections 510 to be halved, whereby the layout area of the select line driver section 500 can be reduced. This contributes to reduction of the manufacturing cost.

Moreover, the difference in charge-up time when applying voltage to each memory cell 410 can be reduced by short-circuiting each end of the two adjacent word lines 50 or each end of the two adjacent select lines 70.

Figure 3:
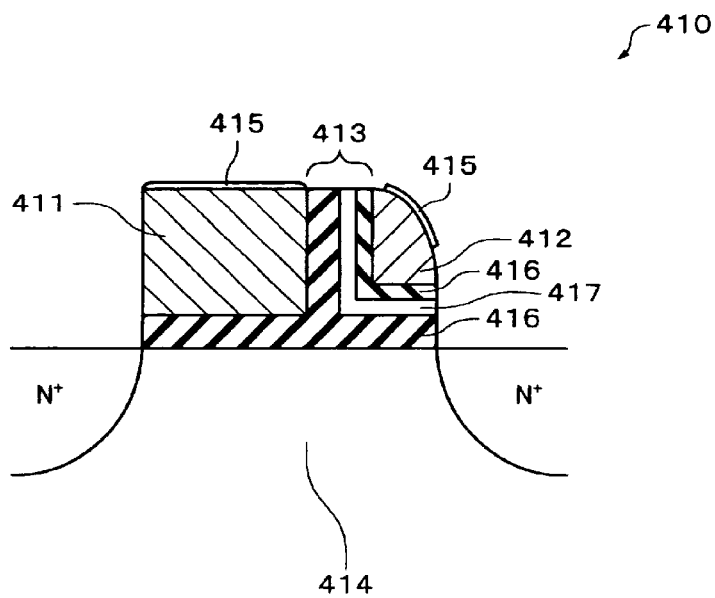
FIG. 3 is a cross-sectional view showing a configuration of a memory cell.

FIG. 3 is a cross-sectional view of the memory cell 410. A numeral 414 indicates a substrate. The select gate 411 and the word gate 412 are disposed on a channel region between source/drain regions (diffusion layers indicated by $N^+$ in FIG. 3) through an insulator film ($SiO_2$, for example) 416. The insulator film 416 may also be formed of a nitride oxide film. The ONO film 413 is formed in the shape of the letter L between the word gate 412 and the channel region. The ONO film 413 also need not be formed in the shape of the letter L and may be merely stacked between the word gate 412 and the channel region. The select gate 411 and the word gate 412 may be formed of poly-silicon. The ONO film 413 may be formed so that a nitride film 417 (SiN, for example) is interposed between oxide films 416 ($SiO_2$, for example). A silicide 415 may be formed on the surfaces of the select gate 411 and the word gate 412. A Co silicide or Ti silicide may be used as the silicide 415. This enables the load resistance values of the select gate 411 and the word gate 412 to be decreased.

Figure 4:
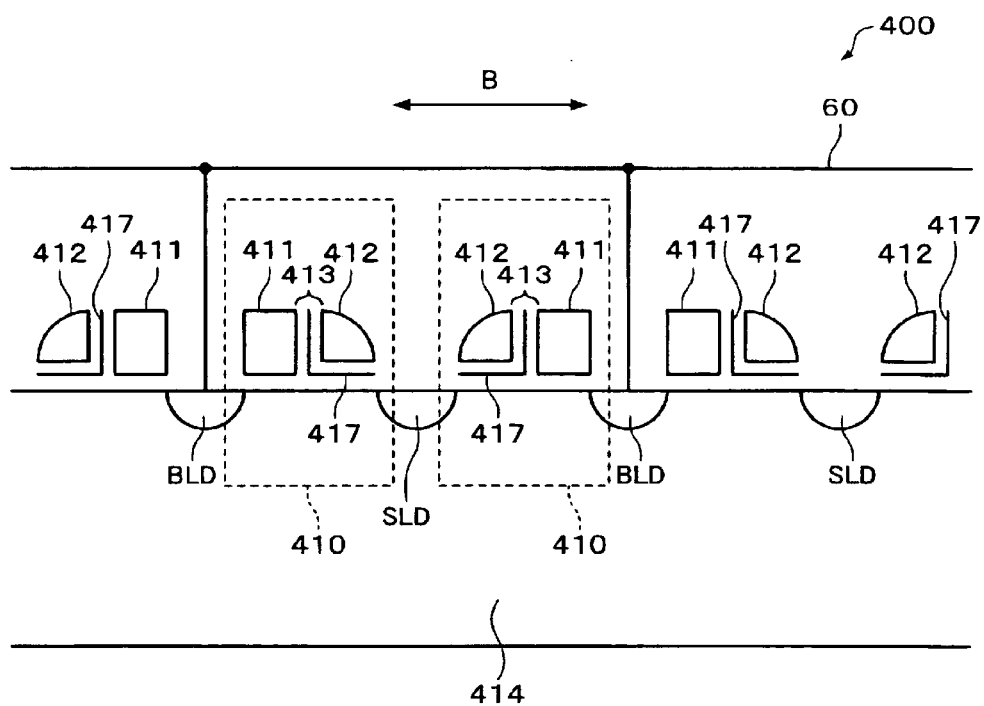
FIG. 4 is a cross-sectional view showing a configuration of a memory block according to an embodiment of the present invention.

FIG. 4 is a cross-sectional view showing a part of the memory block 400 of the present embodiment. In FIG. 4, two memory cells 410 adjacent to each other in the direction B share the bit line diffusion layer BLD interposed between the select gates 411 of the two memory cells 410. Two memory cells 410 adjacent to each other in the direction B share the source line diffusion layer SLD interposed between the word gates 412 of the two memory cells 410. In the cross section shown in FIG. 4, each of the bit line diffusion layers BLD is connected in common with the bit line 60. The bit line diffusion layer BLD and the source line diffusion layer SLD may each be replaced by the other, differing from the above structure. In this case, an output voltage of the bit line driver section (not shown) and an output voltage of the source line driver section 700 are each replaced by the other.

Figure 5:
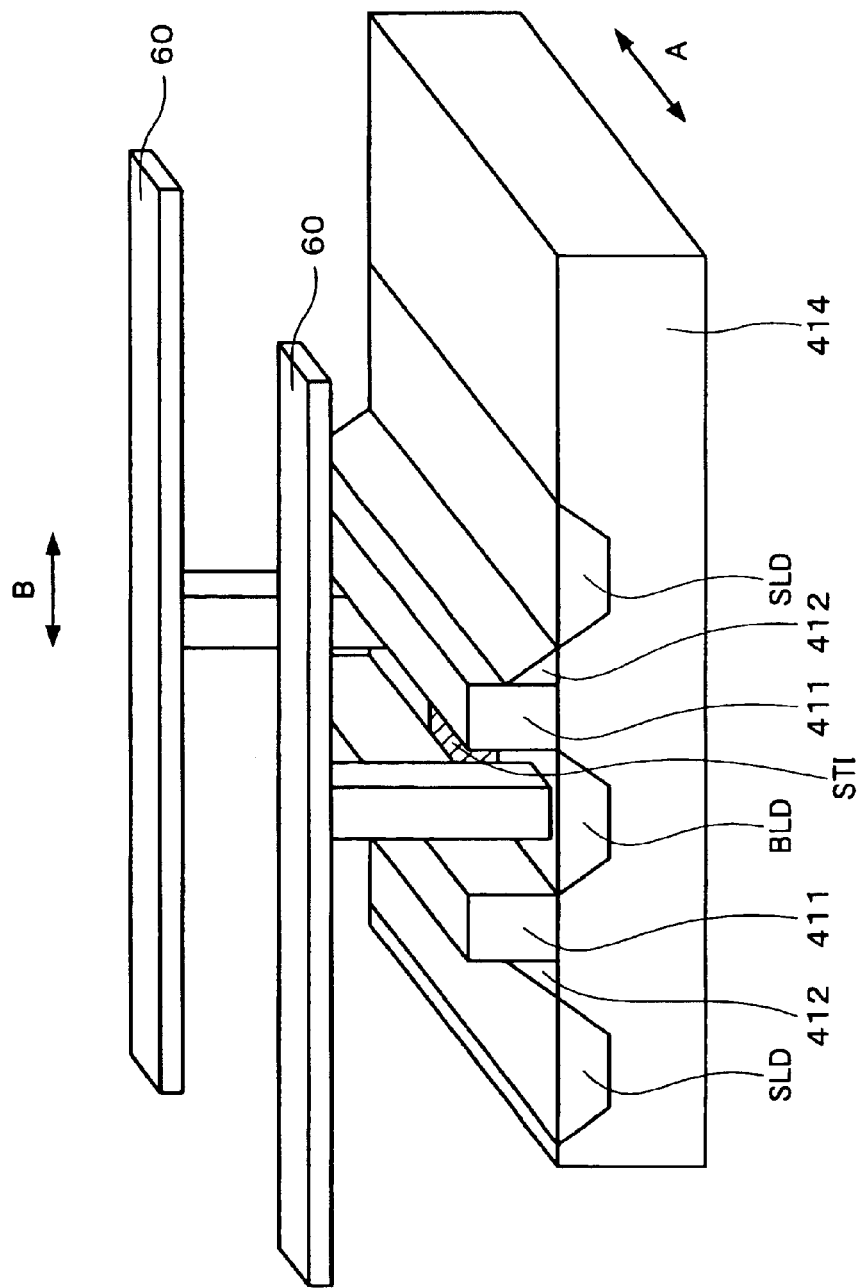
FIG. 5 is a schematic perspective view showing FIG. 4 three-dimensionally.

FIG. 5 is a schematic perspective view three-dimensionally showing FIG. 4. In FIG. 5, the bit line diffusion layers BLD are isolated in the direction A by an element isolation section such as a shallow-trench-isolation (STI). This enables each of the bit lines 60 to be electrically isolated in units of the memory cells 410 arranged along the row direction A. Since the word gate 412 is continuously formed in the column direction A, the word gate 412 may be used as the word line 50. A metal interconnect may be backed along the word gate 412, and the metal interconnect may be used as the word line 50.

Description of Operation

In the present embodiment, each of the memory cells 410 is accessed in units of the memory blocks 400. Specifically, the memory cell 410 is selected by selecting the memory block 400 and then selecting the memory cell 410. The memory cell 410 selected is called a selected memory cell. The memory block 400 including the selected memory cell is called a selected memory block, and the memory blocks 400 other than the selected memory block are called non-selected memory blocks.

The word line 50 selected from the plurality of word lines 50 is called a selected word line, and the word lines 50 other than the selected word line are called non-selected word lines. The bit line 60 selected from the plurality of bit lines 60 is called a selected bit line, and the bit lines 60 other than the selected bit line are called non-selected bit lines. The select line 70 selected from the plurality of select lines 70 is called a selected select line, and the select lines 70 other than the selected select line are called non-selected select lines. The source line 80 selected from the plurality of source lines 80 is called a selected source line, and the source lines 80 other than the selected source line are called non-selected source lines.

The word lines 50, bit lines 60, select lines 70, and source lines 80 in the non-selected memory block are set at 0 V as a non-select voltage in all operations.

An erase operation, a program operation, and a read operation are described below with reference to the drawings.

Erase

Figure 6:
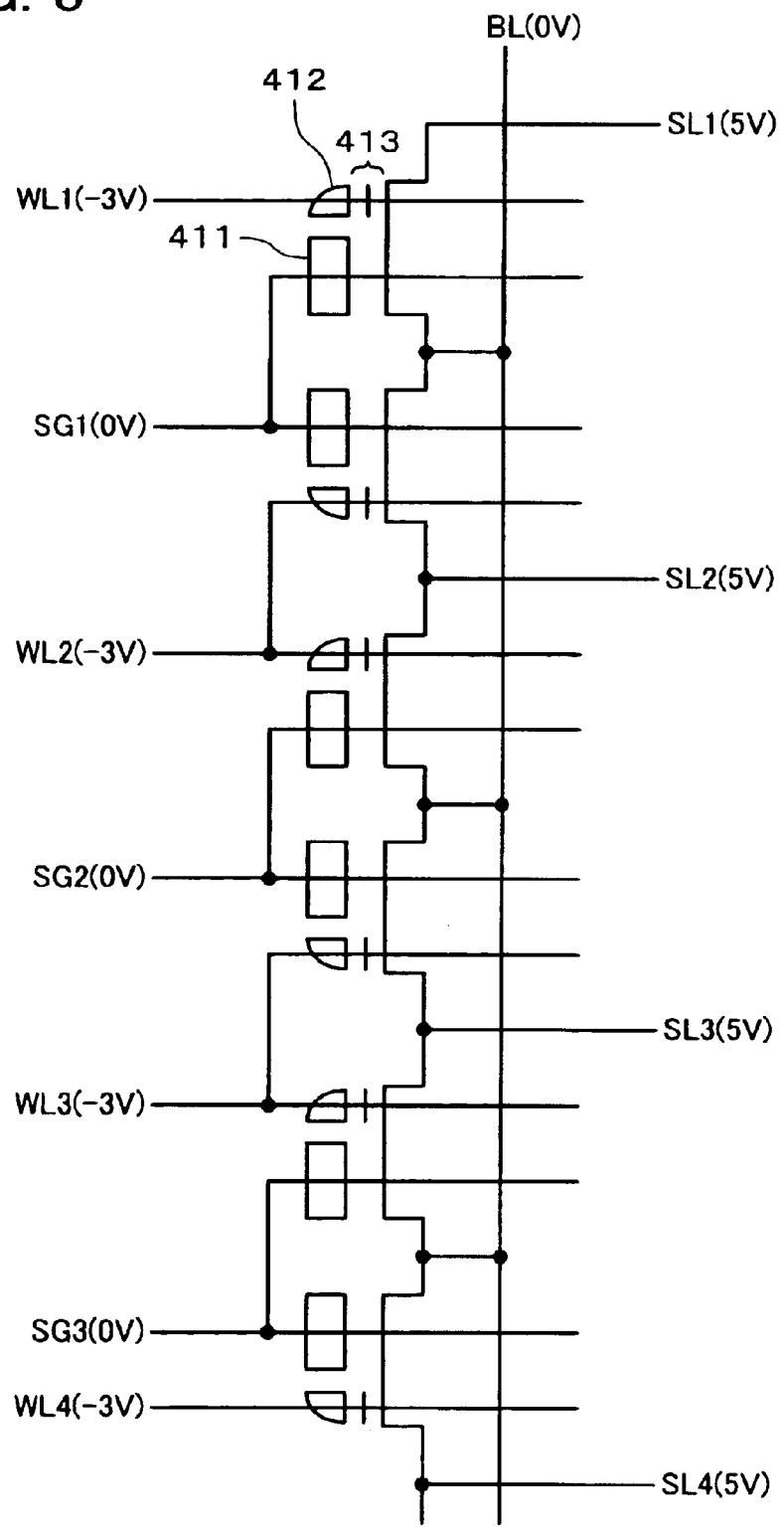
FIG. 6 is a partial diagram of a memory block showing a voltage application state during erasing according to an embodiment of the present invention.

FIG. 6 is a view showing the memory block 400 shown in FIG. 2 together with a voltage application state during erasing. FIG. 6 shows only a part of the selected memory block for convenience of illustration. FIGS. 7, 8, 10, and 11 also show only a part of the selected memory block for the same reason. Symbols WL1 to WL4 indicate the word lines 50. A symbol BL indicates the bit line 60. Symbols SG1 to SG3 indicate the select lines 70. Symbols SL1 to SL4 indicate the source lines 80. In FIGS. 7, 8, 10, and 11, a section indicated by the same symbol as in FIG. 6 has the same meaning as in FIG. 6.

Erasing is performed for all the memory cells 410 in the selected memory block. Specifically, all the memory cells 410 in the selected memory block become the selected memory cells, and the erase operation is performed in block units. All the word lines 50 (including word lines WL1 to WL4) in the selected memory block are charged up to an erasing word voltage (−3 V). All the source lines 80 (including source lines SL1 to SL4) in the memory block are charged up to an erasing source voltage (5 V). All the bit lines 60 and the select lines 70 (including select lines SG1 to SG3) in the memory block are set to an erasing bit voltage and an erasing select voltage (0 V), respectively.

The above-described voltage application state allows a channel to be formed in the channel region between the source line diffusion layer SLD and the bit line diffusion layer BLD. However, since each of the word gates 412 of the memory cells 410 in the selected block is charged up to the erasing word voltage (−3 V), an electric field is generated between each of the word gates 412 and the source line diffusion layer SLD. The charge (electrons) which has been trapped in the ONO film 413 can be erased by hot holes generated by the application of the electric field.

The data is erased by the hot holes in the present embodiment. However, the data may be erased by using a Fowler-Nordheim (FN) erase method. This method uses FN tunneling. The principle of this method is that the charge (electrons) in the ONO film is released from the ONO film 413 by a tunnel effect by applying a predetermined electric field (voltage difference of 15 V, for example) to the ONO film 413.

Program

Figure 7:
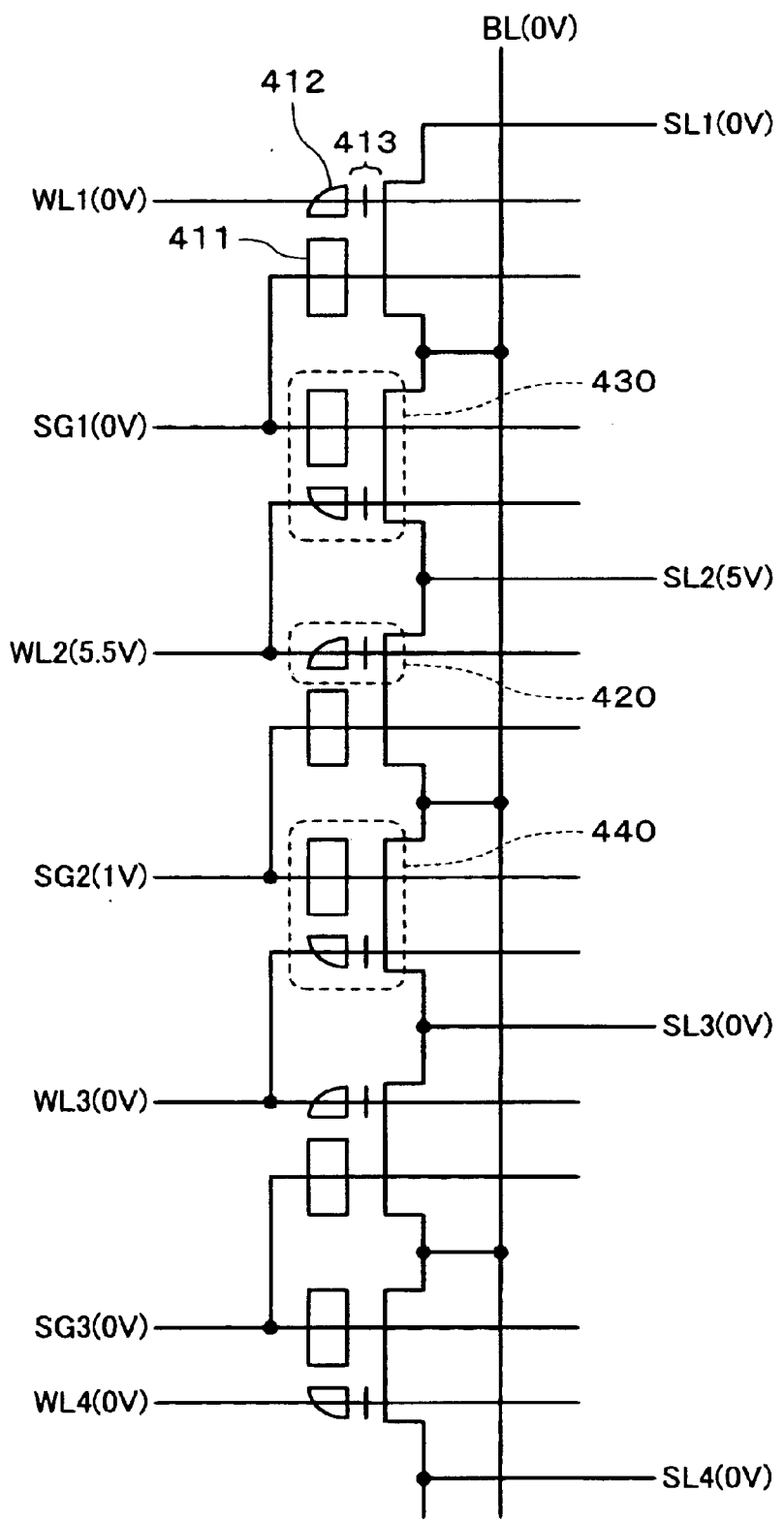
FIG. 7 is a partial diagram of a memory block showing a voltage application state during programming according to an embodiment of the present invention.

FIG. 7 is a view showing the memory block 400 shown in FIG. 2 together with a voltage application state during programming. The memory cell 420 encircled by a dotted line is the selected memory cell.

In FIG. 7, the select line SG2 (selected select line) is charged up to a programming voltage for a selected select line (1 V), and the word line WL2 (selected word line) is charged up to a programming select word voltage (5.5 V). The source line SL2 (selected source line) is charged up to a programming select source voltage (5 V), and all the non-selected source lines including the source lines SL1, SL3, and SL4 are set at a programming non-select source voltage (0 V). All the selected bit lines including the bit line BL are set at a programming select bit voltage (0 V), and all of other bit lines 60, that is, the non-selected bit lines in the selected memory block, are set at a programming non-select bit voltage (Vcc). All the non-selected word lines including the word lines WL1, WL3, and WL4 are set at a programming non-select word voltage (0 V). All the non-selected select lines including the select lines SG1 and SG3 are set at a programming voltage for a non-selected select line (0 V).

The above-described voltage application state allows a channel to be formed in the channel region between the source line diffusion layer SLD and the bit line diffusion layer BLD on each side of the selected memory cell. Since the select gate 411 of the selected memory cell is charged up to the programming voltage for a selected select line (1 V), electrons injected into the channel region become hot electrons. Since the word gate 412 of the selected memory cell is charged up to the programming select word voltage (5.5 V), the hot electrons are drawn toward the word gate 412. The hot electrons drawn are trapped in the ONO film 413.

This is the principle of data writing (programming) of the selected memory cell. However, in the present embodiment, the voltage is applied to the word gates 412 of the two memory cells 410 at the same time from one word line 50. The voltage is also applied to the select gates 411 of the two memory cells 410 at the same time from one select line 70. The reason why the voltages can be applied in this manner is described below.

The word line WL2 shown in FIG. 7 applies the programming select word voltage (5.5 V) to the word gate 412 of the selected memory cell and the word gate 412 of the non-selected memory cell (selected word gate memory cell 430 squarely enclosed by a dotted line shown in FIG. 7) adjacent to the selected memory cell. The source line SL2 applies the programming select source voltage (5 V) to the source line diffusion layer SLD adjacent to the selected word gate memory cell 430.

However, since the select line SG1 which applies the voltage to the select gate 411 of the selected word gate memory cell 430 remains at the programming voltage for a non-selected select line (0 V), electrons do not flow through the channel of the selected word gate memory cell 430. Therefore, since hot electrons are not generated near the bit line diffusion layer BLD, the data in the ONO film of the selected word gate memory cell 430 is not destroyed.

The select line SG2 shown in FIG. 7 applies the programming voltage for a selected select line (1 V) to the select gate 411 of the selected memory cell and the select gate 411 of the non-selected memory cell (selected select gate memory cell 440 squarely enclosed by a dotted line shown in FIG. 7) adjacent to the selected memory cell.

However, since the source line SL3 which applies the voltage to the source line diffusion layer SLD adjacent to the selected select gate memory cell 440 remains at the programming non-select source voltage (0 V), electrons do not flow through the channel region of the selected select gate memory cell 440. Therefore, hot electrons are not generated. Therefore, the data in the ONO film of the selected select gate memory cell 440 is not destroyed.

Read

Figure 8:
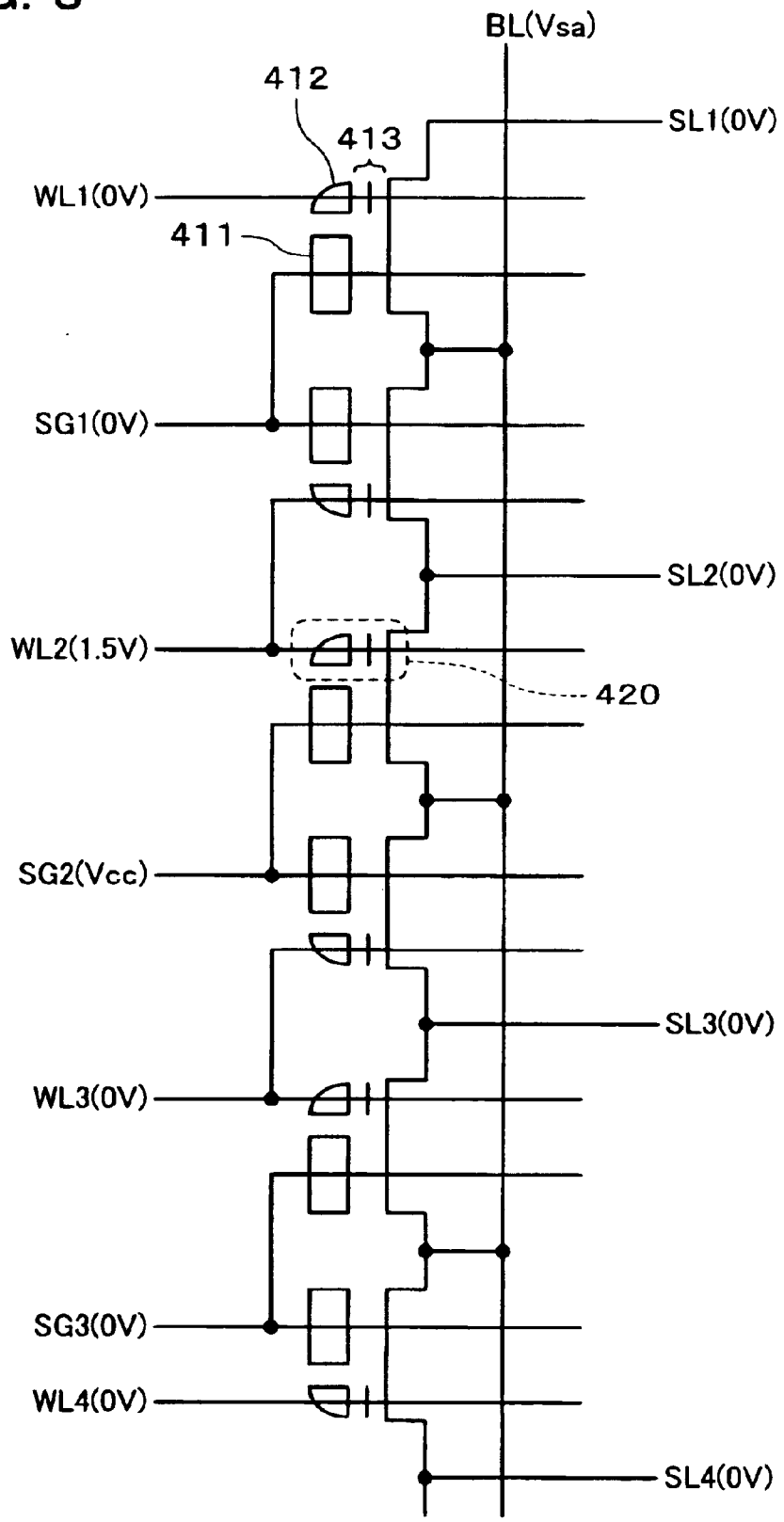
FIG. 8 is a partial diagram of a memory block showing a voltage application state during reading according to an embodiment of the present invention.

FIG. 8 is a view showing the memory block 400 shown in FIG. 2 together with a voltage application state during reading. The memory cell 420 encircled by a dotted line is the selected memory cell.

In FIG. 8, the select line SG2 (selected select line) is charged up to a reading voltage for a selected select line (power supply voltage Vcc), and the word line WL2 (selected word line) is charged up to a reading select word voltage (1.5 V). All the source lines 80 including the source lines SL1 to SL4 are set at a reading select source voltage (0 V). All the selected bit lines including the bit line BL are set at a reading select bit voltage (Vsa, 1 V, for example), and all of other bit lines 60, that is, the non-selected bit lines in the selected memory block, are set at a reading non-select bit voltage (0 V). All the non-selected word lines including the word lines WL1, WL3, and WL4 are set at a reading non-select word voltage (0 V). All the non-selected select lines including the select lines SG1 and SG3 are set at a reading voltage for a non-selected select line (0 V).

The above-described voltage application state allows a channel to be formed in the channel region between the bit line diffusion layer BLD and the source line diffusion layer SLD of the selected memory cell by the word gate 412 and the select gate 411 of the selected memory cell. Since the bit line BL is charged up to the voltage Vsa, a current (IDS) flows through the channel region.

Figure 9:
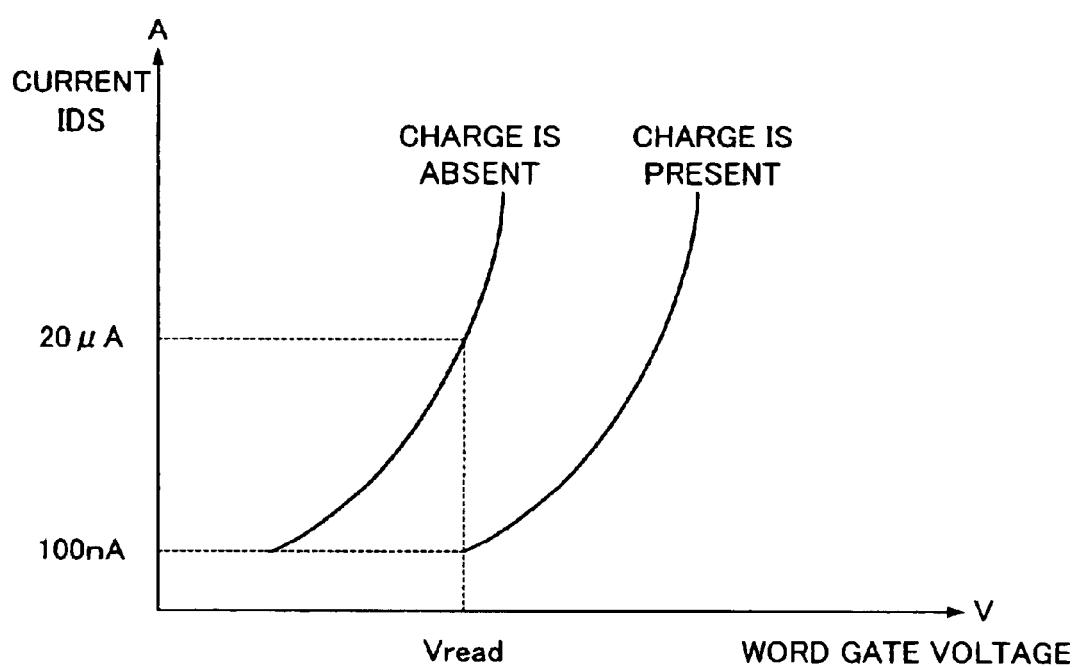
FIG. 9 is a graph showing the relation between the presence or absence of a charge in an ONO film and a flowing current.

The three-layer structure of the memory cell 410 consisting of the word gate 412, the ONO film, and the channel region may be regarded as a MOS transistor. The threshold value of the transistor becomes higher in the state in which a charge is trapped in the ONO film than in the state in which a charge is not trapped in the ONO film. FIG. 9 is a graph showing the correlation between the presence or absence of a charge and a current which flows between the source line diffusion layer SLD and the bit line diffusion layer BLD.

In FIG. 9, when applying a voltage Vread to the word gate 412, about 20 $\mu$A of the current IDS flows in the case where a charge is not trapped in the ONO film, and the current IDS flows only to a small extent in the case where a charge is trapped. Specifically, since the threshold value of the transistor is increased in the case where charge is trapped in the ONO film, the current IDS flows only to a small extent if the voltage Vread is applied to the word gate 412.

The data retained in the selected memory cell can be read by reading the amount of current by using a sense amplifier (not shown) provided for each bit line 60.

This is the principle of data reading from the selected memory cell. However, in the present embodiment, the voltage is applied to the word gates 412 of the two memory cells 410 at the same time from one word line 50. The voltage is also applied to the select gates 411 of the two memory cells 410 at the same time from one select line 70.

The reason why the voltages can be applied in this manner is the same as that during programming. Specifically, in order to access one memory cell 410 as the selected memory cell among the plurality of memory cells 410, it is necessary to apply predetermined voltages to the select gate 411 and the word gate 412 of the memory cell 410 to be accessed. The memory cell cannot become the selected memory cell if the predetermined voltages are not applied to both the select gate 411 and the word gate 412.

In the present embodiment, among the memory cells 410 connected with the single bit line 60, there is only one memory cell 410 in which the predetermined voltages are applied to both the select gate 411 and the word gate 412 (selected memory cell).

The reverse reading is performed in the present embodiment. Specifically, a high voltage is applied to the source line diffusion layer SLD during programming, and a high voltage is applied to the bit line diffusion layer BLD during reading. The reverse reading increases accuracy of current read during reading. However, forward reading may also be used as the read method. In this case, each of the voltage values applied to the source line diffusion layer SLD and the bit line diffusion layer BLD in the present embodiment is replaced by the other.

Comparison with Comparative Example and Effect

Figure 10:
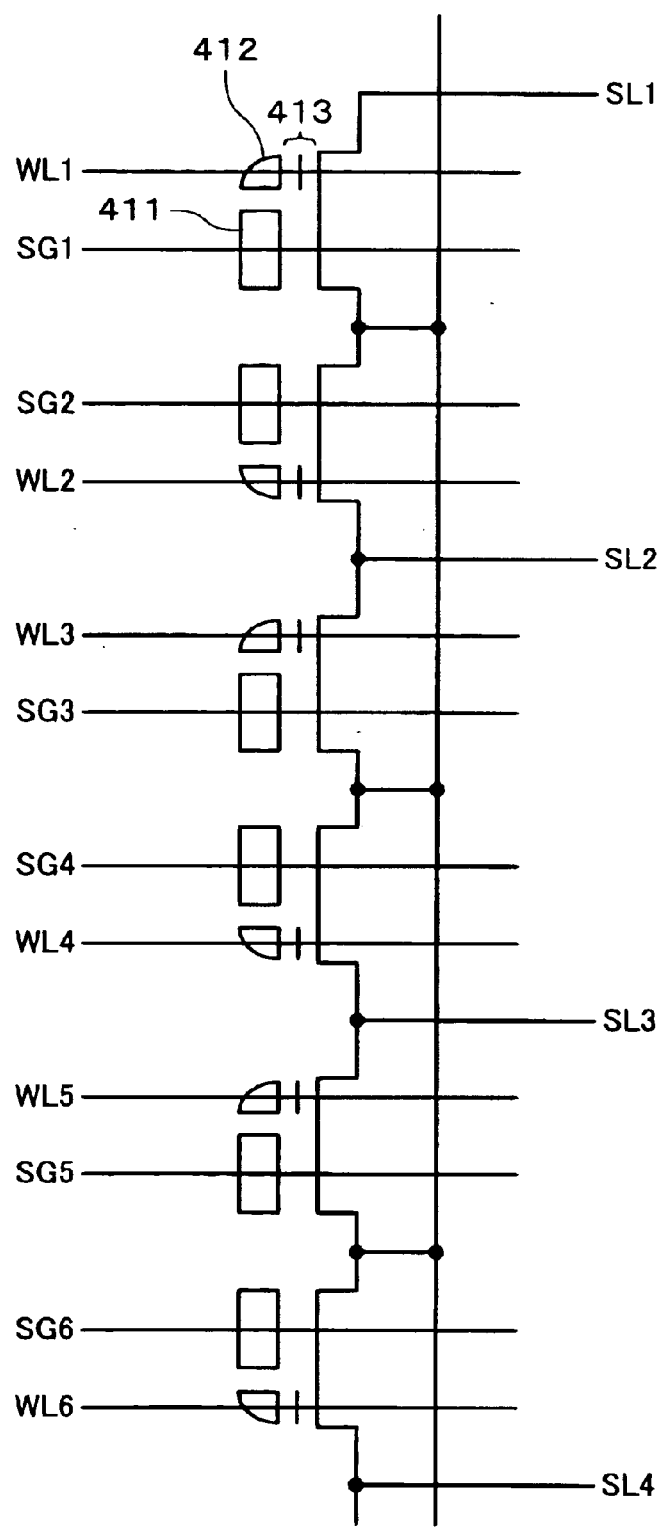
FIG. 10 is a partial diagram of a memory block according to a first comparative example.
Figure 11:
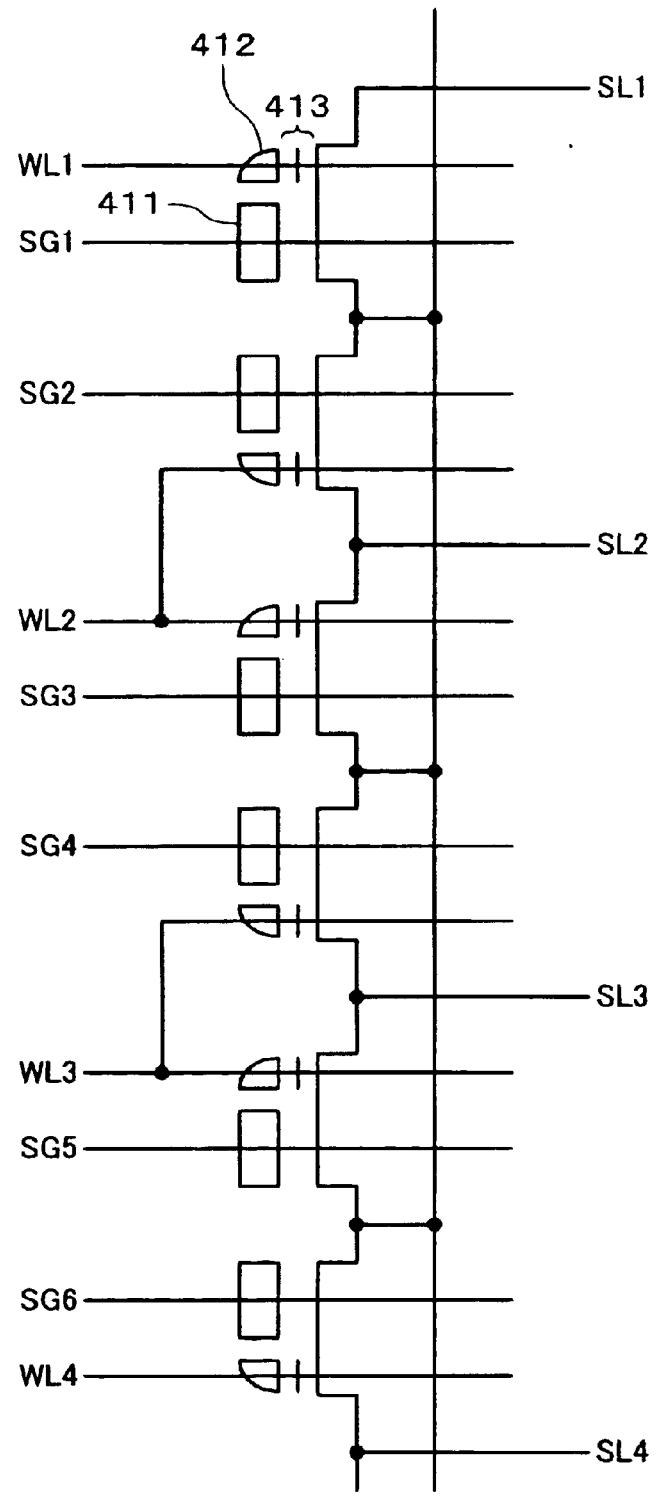
FIG. 11 is a partial diagram of a memory block according to a second comparative example.

FIG. 10 is a circuit diagram showing the memory block 400 in a first comparative example. Symbols WL1 to WL6 indicate the word lines 50. Symbols SG1 to SG6 indicate the select lines 70. In FIG. 11, a section indicated by the same symbol as in FIG. 10 has the same meaning as in FIG. 10.

In FIG. 10, one word line 50 and one select line 70 are connected with each of the memory cells 410 in the memory block 400 of the first comparative example. The word line 50 and the select line 70 are respectively driven by the unit word line driver section 310 and the unit select line driver section 510. Specifically, in the first comparative example, the unit word line driver sections 310 and the unit select line driver sections 510 are necessary for the number of select lines 70. Moreover, since the interconnect pitch is limited, it is necessary to contrive the arrangement method in order to dispose a number of driver sections. This results in an increase in the layout area.

In the present embodiment, the number of word lines 50 and the number of select lines 70 are reduced by half compared to those in the first comparative example. Therefore, the number of unit word line driver sections 310 and the number of unit select line driver sections 510 required are also reduced by half.

The layout area of the word line driver section 300 and the select line driver section 500 can be significantly reduced by reducing the number of unit word line driver sections 310 and unit select line driver sections 510, for which a comparatively large layout area is necessary.

FIG. 11 is a circuit diagram showing the memory block 400 in a second comparative example. In FIG. 11, one word line 50 is connected with the word gates 412 of two memory cells 410. This enables the number of unit word line driver sections 310 to be reduced by half compared to the number of unit word line driver sections 310 in the first comparative example, whereby the layout area of the word line driver section 300 can be reduced. However, since the select line 70 is connected with only one select gate 411, the unit select line driver sections 510 are necessary for the number of memory cells 410 connected with the single bit line 60. In the present embodiment, since the necessary number of unit select line driver sections 510 can be more significantly reduced than the number of memory cells 410 connected with the single bit line 60, the layout area of the select line driver section 500 can be reduced in comparison with the second comparative example.

Specifically, use of the present embodiment enables the layout area of the word line driver section 300 and the select line driver section 500 to be significantly reduced. This enables the manufacturing cost to be significantly reduced.

The present invention can provide a nonvolatile semiconductor memory device having a small layout area as described above.

The present invention is not limited to the above-described embodiment. Various modifications and variations are possible without departing from the spirit and scope of the present invention.

What is claimed is:

1. A nonvolatile semiconductor memory device comprising a memory cell array including a plurality of memory cells disposed in a row direction and a column direction, wherein each of the memory cells includes a source region, a drain region, a channel region between the source region and the drain region, a word gate, a select gate, and a nonvolatile memory element formed between the word gate and the channel region, the word gate and the select gate being disposed to face the channel region, wherein the memory cell array includes:

a plurality of word lines each of which is commonly connected with the word gates of the memory cells in each row;

a plurality of bit lines each of which is commonly connected with the drain regions or the source regions of the memory cells in each column;

a word line driver section which drives the word lines; and a bit line driver section which drives the bit lines, wherein the word line driver section includes a plurality of unit word line driver sections, and wherein each of the unit word line driver sections drives two of the word lines connected respectively with two of the word gates adjacent to each other in the column direction.

2. The nonvolatile semiconductor memory device as defined in claim 1,
wherein the two word lines driven by each of the unit word line driver sections are short-circuited.

3. The nonvolatile semiconductor memory device as defined in claim 1,
wherein each of the memory cells includes a first region adjacent to the source region and a second region adjacent to the drain region in the channel region, and
wherein the select gate is disposed over the first region and the word gate is disposed over the second region with the nonvolatile memory element interposed in-between.

4. The nonvolatile semiconductor memory device as defined in claim 1,
wherein each of the memory cells includes a first region adjacent to the source region and a second region adjacent to the drain region in the channel region, and
wherein the word gate is disposed over the first region with the nonvolatile memory element interposed in-between and the select gate is disposed over the second region.

5. The nonvolatile semiconductor memory device as defined in claim 1,
wherein the memory cell array includes:
a plurality of select lines each of which is commonly connected with the select gates of the memory cells in each row; and
a select line driver section which drives the select lines,
wherein the select line driver section includes a plurality of unit select line driver sections, and
wherein at least one of the unit select line driver sections drives two of the select lines connected respectively with two of the select gates adjacent to each other in the column direction.

6. The nonvolatile semiconductor memory device as defined in claim 5,
wherein the two select lines driven by at least one of the unit select line driver sections are short-circuited.

7. The nonvolatile semiconductor memory device as defined in claim 1,
wherein the nonvolatile memory element is formed of an ONO film which includes two oxide films (O) and a nitride film (N) between the two oxide films (O).

* * * * *